United States Patent
Notohardjono et al.

(10) Patent No.: US 11,060,948 B2
(45) Date of Patent: Jul. 13, 2021

(54) RIVETED JOINT RACK ANALYSIS

(71) Applicant: International Business Machines Corporation, Armonk, NY (US)

(72) Inventors: Budy D. Notohardjono, Poughkeepsie, NY (US); Shawn Canfield, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 276 days.

(21) Appl. No.: 15/418,056

(22) Filed: Jan. 27, 2017

(65) Prior Publication Data

US 2018/0218089 A1 Aug. 2, 2018

(51) Int. Cl.
G01M 7/02 (2006.01)
G06F 30/17 (2020.01)
G01M 1/16 (2006.01)

(52) U.S. Cl.
CPC .............. G01M 7/025 (2013.01); G01M 1/16 (2013.01); G06F 30/17 (2020.01)

(58) Field of Classification Search
CPC .......... G06F 17/50; G06F 30/17; G01M 1/16; G01M 7/025
See application file for complete search history.

(56) References Cited

U.S. PATENT DOCUMENTS

| | | | |
|---|---|---|---|
| 5,765,313 A * | 6/1998 | Lee | E01D 19/00 188/304 |
| 6,847,923 B2 | 1/2005 | Donovan | |
| 7,499,845 B1 | 3/2009 | Quincy et al. | |
| 8,659,905 B2 | 2/2014 | Knoop | |

(Continued)

FOREIGN PATENT DOCUMENTS

| | | |
|---|---|---|
| CN | 201020232295 U | 6/2010 |
| CN | 201697830 U | 1/2011 |

(Continued)

OTHER PUBLICATIONS

AutoDesk, Bolts abd Other Fasteners, Simulation Mechanical 2016, May 13, 2015 https://knowledge.autodesk.com/support/simulation-mechanical/learn-explore/caas/CloudHelp/cloudhelp/2016/ENU/SimMech-UsersGuide/files/GUID-C02A97A6-375F-41D3-A157-F0850B29FC07-htm.html (Year: 2015).*
Osama Bedair, Cost-effective modeling strategies for the analysis of spliced steel connections, Applied Mathematical Modelling 35 (2011) 1881-1892 (Year: 2011).*
B. D. Notohardjono et al, Modular server frame with robust earthquake retention IBM J. Res. & Dev. vol. 45 No. 6 Nov. 2001 (Year: 2001).*

(Continued)

*Primary Examiner* — Chuen-Meei Gan
(74) *Attorney, Agent, or Firm* — Cantor Colburn LLP; Tihon Poltavets

(57) ABSTRACT

A method to analyze a rack with riveted joints is provided. The method includes importing a computer aided design (CAD) model of a rack and finding all annular edges in the CAD model with a predefined parameter. The method further includes gathering coordinates of nodes on the found annular edges, calculating average coordinates for the nodes of each found annular edge and identifying the average coordinates as a center point for each found annular edge. The method also includes identifying pairs of proximal center points and, for each pair of proximal center points, connecting the nodes on the found annular edges with the corresponding center point with rigid constraints and generating a beam element connecting the proximal center points in accordance with the rigid constraints.

12 Claims, 11 Drawing Sheets

(56) References Cited

U.S. PATENT DOCUMENTS

| | | |
|---|---|---|
| 9,215,828 B1 | 12/2015 | Yang |
| 10,303,809 B2* | 5/2019 | Banta .................. G06F 30/17 |
| 2003/0046039 A1* | 3/2003 | Donovan ............ G06F 17/5018 703/1 |
| 2006/0080907 A1* | 4/2006 | Hulls .................... E04H 9/02 52/167.1 |
| 2008/0165188 A1* | 7/2008 | Uraki .................... G06F 17/50 345/420 |
| 2010/0286966 A1* | 11/2010 | Hallquist ............ G06F 17/5018 703/2 |
| 2016/0178492 A1 | 6/2016 | Hirakawa et al. |

FOREIGN PATENT DOCUMENTS

| | | |
|---|---|---|
| CN | 104217067 A | 12/2014 |
| EP | 2869068 A1 | 5/2015 |
| JP | 2004322198 A | 11/2004 |

OTHER PUBLICATIONS

Louis Bucciarelli. 1.050 Solid Mechanics. Fall 2004. Massachusetts Institute of Technology: MIT OpenCourseWare, https://ocw.mit.edu. License: Creative Commons BY-NC-SA. (Year: 2004).*

Arumulla et al., "Analysis of Rivets Using Finite Element Analysis", International Journal of Computational Engineering Research, 2013, 6 pages.

Bouchard et al, "Numerical modeling of self-pierce riveting—From riveting process modeling down to structural analysis", Elsevier, 2007, pp. 290-300.

Kaniowski et al., "Methods for Fern Analysis of Riveted Joints of Thin-Walled Aircraft Structures within the Imperja Project", 25th ICAF Symposium, 2009, 29 pages.

Xiong et al., "Analytical and finite element modeling of riveted lap joints in aircraft structure", AIAA Journal, 1999, pp. 93-99 (Abstract).

* cited by examiner

RIVETED JOINT RACK ANALYSIS

BACKGROUND

The present invention relates to racks and other mechanical assemblies and, more particularly, to a method and procedure to analyze riveted joint racks, also referred to as chassis.

A rack or chassis is a frame or enclosure for mounting multiple computing equipment modules. Each module has a front panel that may be about 19 inches (48.3 cm) wide including the edges or "ears" that protrude on each side and which allow modules to be fastened to the frame. Rack-mountable equipment is traditionally mounted by bolting or clipping its front panel to the rack. Within the information technology (IT) industry, for example, it is common for network/communications equipment to have multiple mounting positions, such as table-top and wall mounting, so rack mountable equipment will often feature L-brackets that must be screwed or bolted to the equipment prior to mounting in a rack.

A key structural weakness of racks is the shear stress placed on mounting rails and leading edges of the equipment. As a result, 4-post racks have become common, with such racks featuring a mirrored pair of rear mounting posts. Since the spacing between the front and rear mounting posts may differ between rack vendors and/or the configuration of the rack (some racks may incorporate front and rear rails that may be moved forwards and backwards, i.e. APC SX-range racks), it's common for equipment that features 4-post mounting brackets to have an adjustable rear bracket.

However racks are built, their frame is often formed of a riveted frame construction with up to about 12,412 rivet joints. In such cases, there may be a need to conduct an analysis to assess the ability of the frame to meet earthquake tests. Such analysis aims to obtain the dynamic performance of the frame by determining a resonance frequency thereof especially in the side-to-side (narrow side) direction. This resonance frequency is an indication of the dynamic stiffness of the rack structure with higher resonance frequencies being associated with higher frame stiffness and the ability of the frame to withstand the earthquake testing.

SUMMARY

According to an embodiment of the present invention, a method to analyze a rack with riveted joints is provided. The method includes importing a computer aided design (CAD) model of a rack and finding all annular edges in the CAD model with a predefined parameter. The method further includes gathering coordinates of nodes on the found annular edges, calculating average coordinates for the nodes of each found annular edge and identifying the average coordinates as a center point for each found annular edge. The method also includes identifying pairs of proximal center points and, for each pair of proximal center points, connecting the nodes on the found annular edges with the corresponding center point with rigid constraints and generating a beam element connecting the proximal center points in accordance with the rigid constraints.

According to another embodiment of the present invention, a computer program product for analyzing a rack with riveted joints is provided. The computer program product includes a processor and a memory unit. The memory unit has executable instructions stored thereon. When executed, these executable instructions cause the processor to execute a method. The method includes importing a computer aided design (CAD) model of a rack and finding all annular edges in the CAD model with a predefined parameter. The method further includes gathering coordinates of nodes on the found annular edges, calculating average coordinates for the nodes of each found annular edge and identifying the average coordinates as a center point for each found annular edge. The method also includes identifying pairs of proximal center points and, for each pair of proximal center points, connecting the nodes on the found annular edges with the corresponding center point with rigid constraints and generating a beam element connecting the proximal center points in accordance with the rigid constraints.

According to yet another embodiment of the present invention, a system for analyzing a rack with riveted joints is provided. The system includes a processor and a memory unit. The memory unit has executable instructions stored thereon. When executed, the executable instructions cause the processor to import a computer aided design (CAD) model of a rack and find all annular edges in the CAD model with a predefined parameter. When executed, the executable instructions further cause the processor to gather coordinates of nodes on the found annular edges, calculate average coordinates for the nodes of each found annular edge and identify the average coordinates as a center point for each found annular edge. The executable instructions, when executed, also cause the processor to identify pairs of proximal center points and, for each pair of proximal center points, connect the nodes on the found annular edges with the corresponding center point with rigid constraints and generate a beam element connecting the proximal center points in accordance with the rigid constraints.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As will be described below, while conventional structure analysis is based on the assumption that all rivets in a frame are bonded or glued together and thus results in significantly high stiffness calculations and misleading results, a method is now provided to conduct a dynamic analysis of rivet joints to obtain more accurate and realistic results. That is, a simplified procedure and a method are provided for executing a structural finite element analysis (FEA) model of a riveted frame in which rivet joints of two parallel or overlapping plates are each represented as a discrete beam element.

Figure 1:
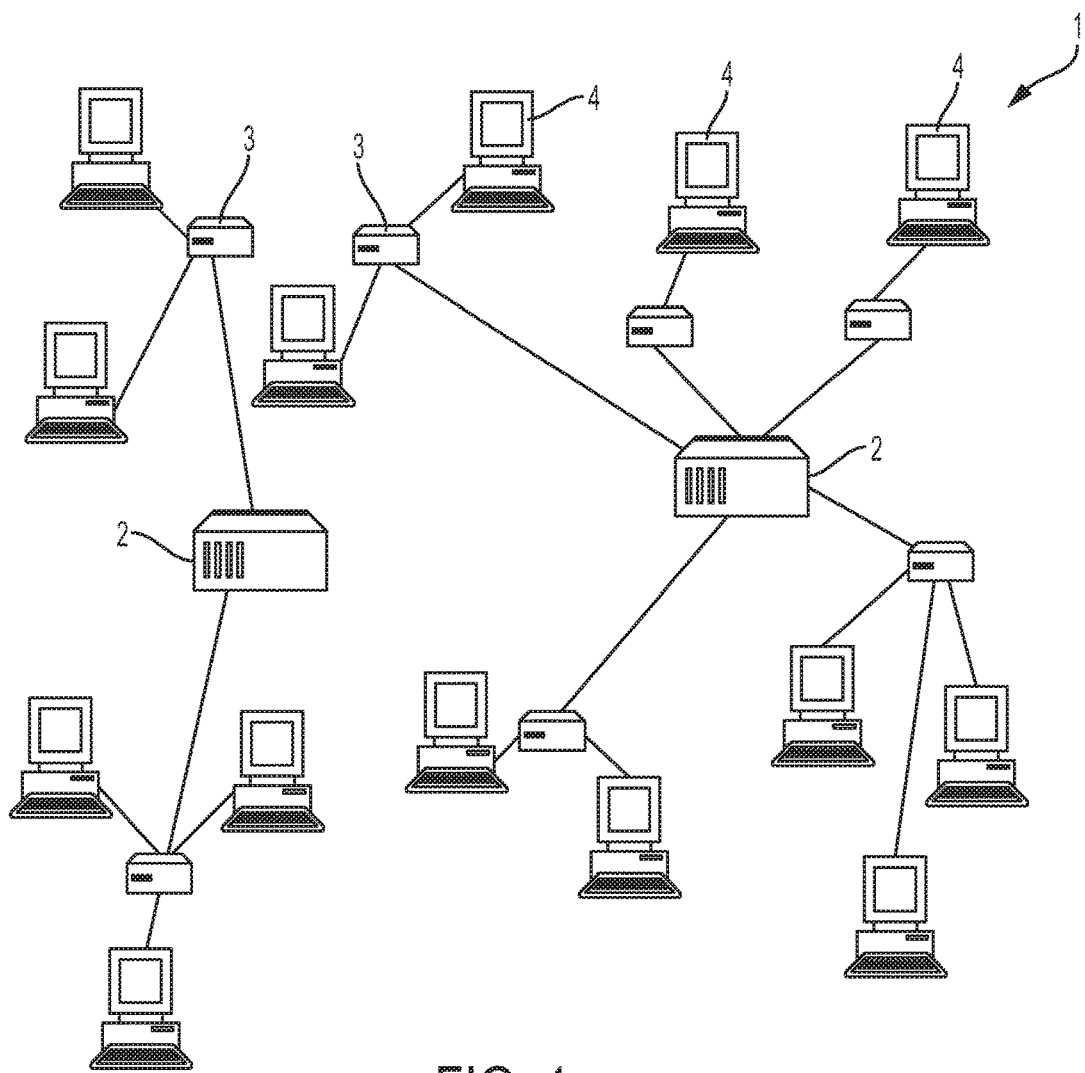
FIG. 1 is a schematic illustration of a system for analyzing a rack with riveted joints in accordance with embodiments.
Figure 2:
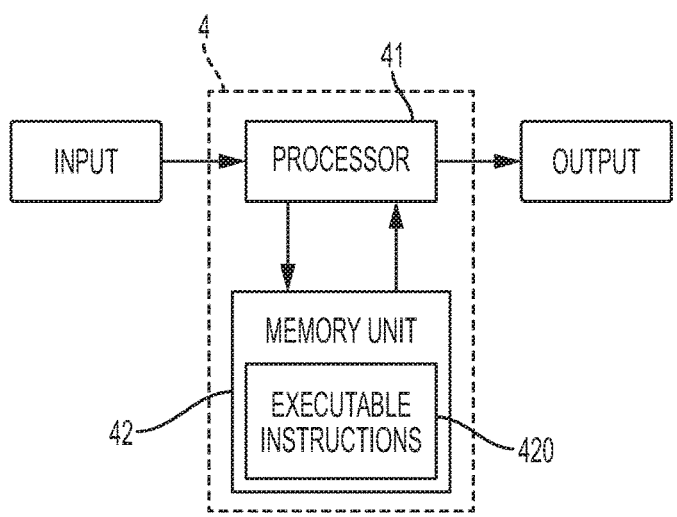
FIG. 2 is a schematic illustration of a computing device of the system of FIG. 1.

With reference to FIGS. 1 and 2, a computing system 1 is provided and includes one or more servers 2, one or more host computers 3 and one or more client computers 4. Each one of the servers 2, the host computers 3 and the client computers 4 includes a memory unit, a processor and a networking unit by which each of the servers 2, the host computers 3 and the client computers 4 are communicative with one another. As shown in FIG. 2, at least the client computers 4 include a processor 41 and a memory unit 42. The processor 41 may be provided as a central processing unit (CPU) or as a processing circuit. The memory unit 42 may include read-only and random access memory, for example, and has executable instructions 420 stored thereon. The executable instructions, when executed, cause the processor 41 to execute the methods described herein.

Figure 3:
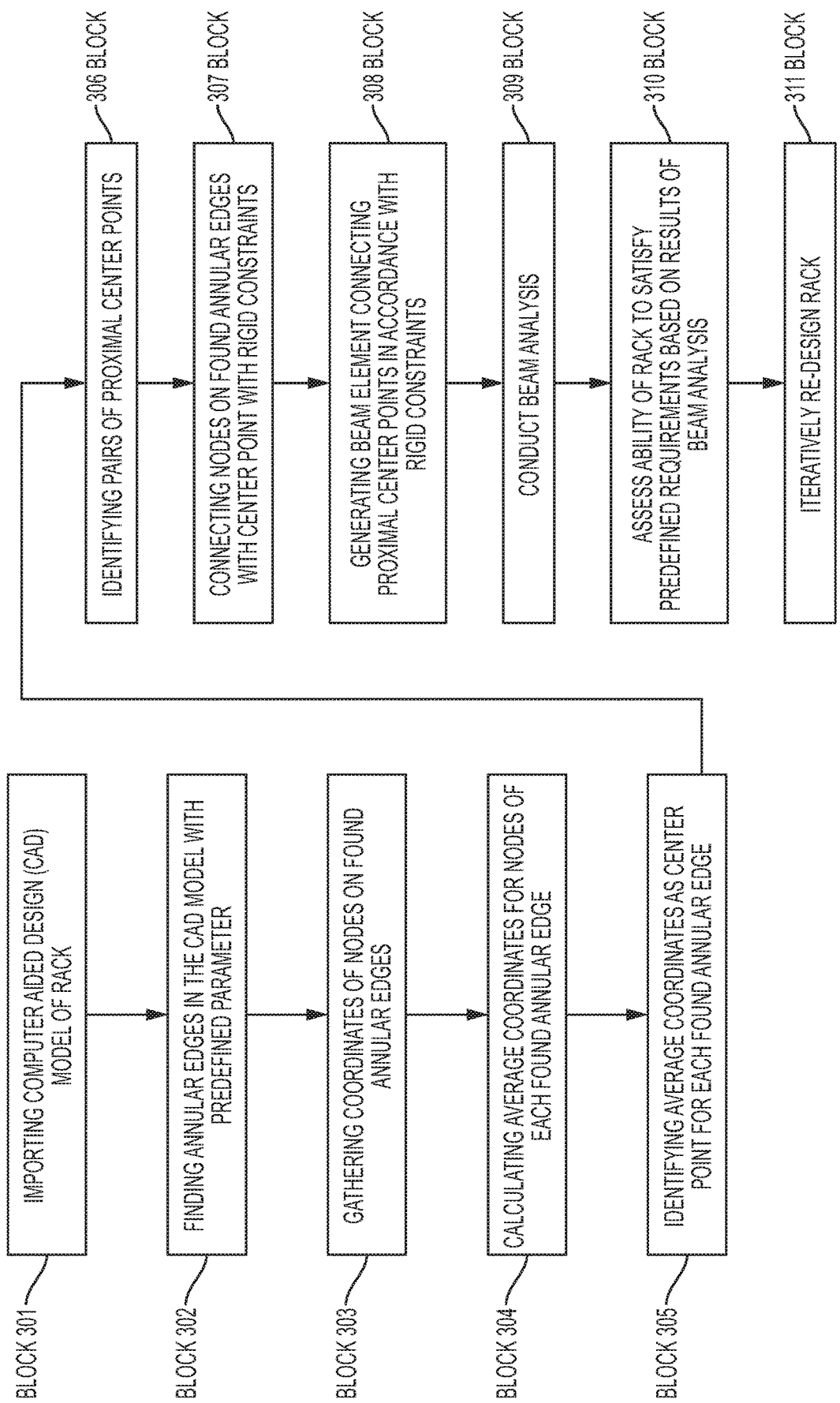
FIG. 3 is a flow diagram illustrating a method of analyzing a rack with riveted joints in accordance with embodiments.

With reference to FIG. 3, the methods include importing a computer aided design (CAD) model of a rack or chassis or other mechanical assemblies (hereinafter referred to collectively as a "rack") (block 301) and finding all annular edges in the CAD model with a predefined parameter (block 302). The methods further include gathering coordinates of most or all nodes on the found annular edges (block 303), calculating average coordinates for the most or all nodes of each found annular edge (block 304) and identifying the average coordinates as a center point for each found annular edge (block 305). The methods also include identifying pairs of proximal center points (block 306) and, for each pair of proximal center points, connecting the most or all nodes on the found annular edges with the corresponding center point with rigid constraints (block 307) and generating a beam element connecting the proximal center points in accordance with the rigid constraints (block 308).

In accordance with further embodiments and, as shown in FIG. 3, the executable instructions 420, when executed, cause the processor 41 to conduct a beam analysis of each generated beam element (block 309), to assess an ability of the rack to satisfy predefined requirements based on results of the beam analysis (block 310) and to iteratively re-design the rack in accordance with a determination that the rack is unable to satisfy the predefined requirements until the rack is determined to be able to satisfy the predefined requirements (block 311).

In accordance with embodiments, the annular edges may include circular edges or edges of nearly circular or rounded shape and the predefined parameter includes a diameter of the circular edges that is equal to or less than a predefined or known rivet joint diameter. In addition, it is to be understood that the most or all nodes may include at least six or more evenly distributed nodes for each annular edge and that the pairs of proximal center points may include those pairs of center points which are separated from one another by distances that are equal to or less than a predefined or known maximum sheet metal thickness.

In greater detail, with reference to FIGS. 4-9 and to FIG. 10, an exemplary deployment of the methods described herein is illustrated and will be described below.

Figure 4:
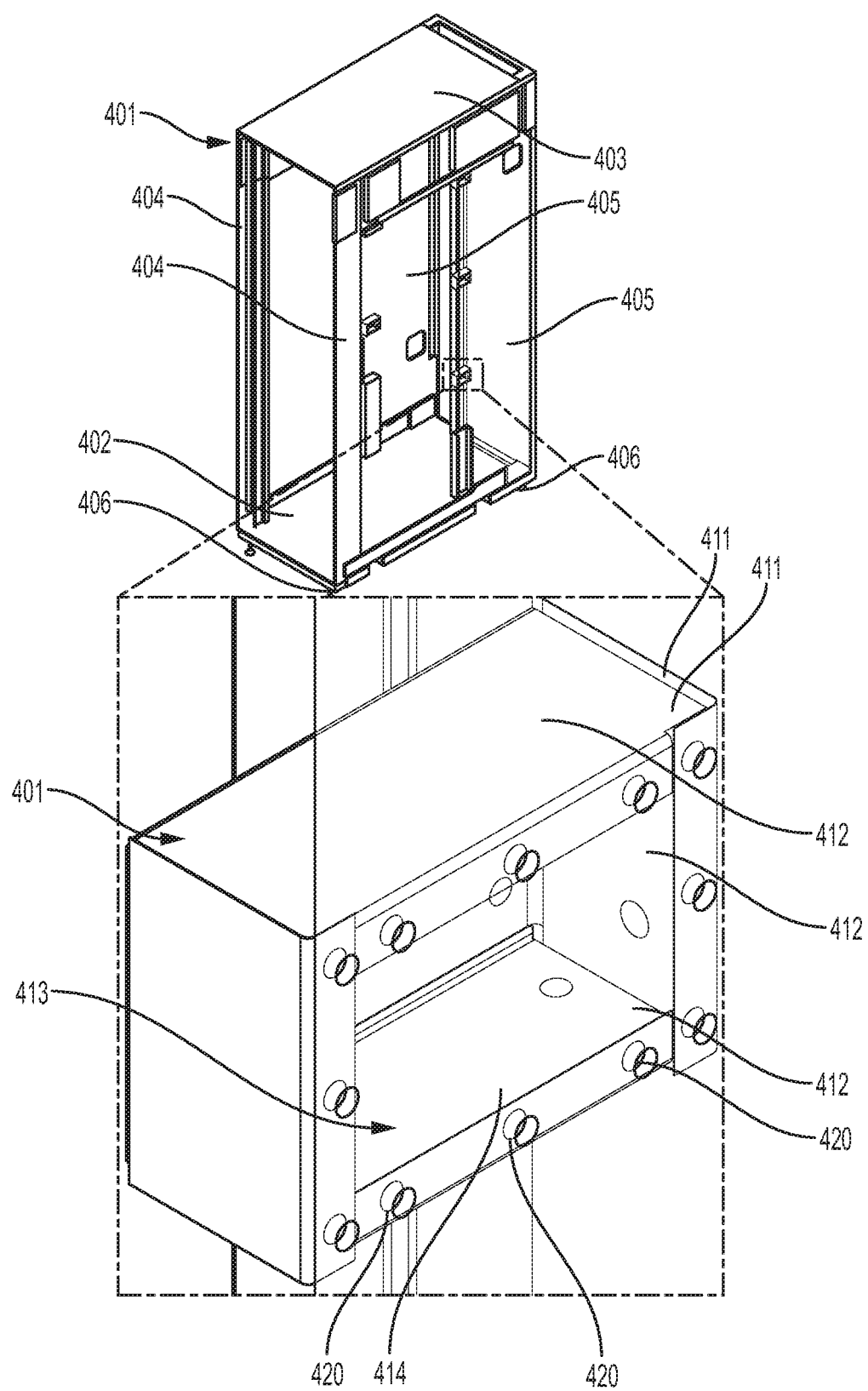
FIG. 4 is a perspective view of a portion of a rack.

As shown in FIG. 4, a three-dimensional rack design 401 is provided and serves as a specification for the eventual building and assembly of an actual rack that would be used for the storing and supporting of multiple computing resources in a substantially vertical arrangement. The rack design 401 includes a base 402, a ceiling 403, rails 404 that support the ceiling 403 over the base 402, side and rear panels 405 that serve to protect and possibly provide for interconnections between the multiple computing resources and lockable wheels 406. The base 402 sits on the lockable wheels 406 such that, when the lockable wheels 406 are unlocked, the rack 401 as a whole may be moved from one location to another. The rack design 401 also includes a housing design 410 that is disposable along one of the rails 404. The housing design 410 can be provided as a specification for the eventual building and assembly of an actual housing that would be attachable to the rack for the storage of one or more additional components and/or for increasing a structural stability of the rack.

As shown in the insert of FIG. 4, the housing design 410 includes multiple part details 411 that are each designed to be formed of one or more sheet metals and which indicate that the one or more sheet metals are bent and organized or fit together to define wall feature details 412, an aperture detail 413 and an interior detail 414. Each of the multiple part details 411 is further formed to define one or more rivet hole details 420. Rivets or other fasteners can be inserted into the embodiments of the one or more rivet hole details 420 to secure the embodied multiple part details 411 together and in fact to secure each individual component of the embodied rack design 401 as a whole together.

With the rack design 401 and the housing design 410 established, the rack design 401 and the housing design 410 are imported into the memory unit 42 of the at least one of the client computers 4 or any other one of the one or more servers 2, the one or more host computers 3 and the one or more client computers 4 as illustrated in block 301 of FIG. 3. For the sake of clarity and brevity, the following description will relate to the case in which the rack design 401 and the housing design 410 are imported into the memory unit 42 of one of the client computers. It will also be understood that the housing design 410 serves as a stand-in for each and every additional design detail that might be included or added onto the rack design 401.

Figure 5:
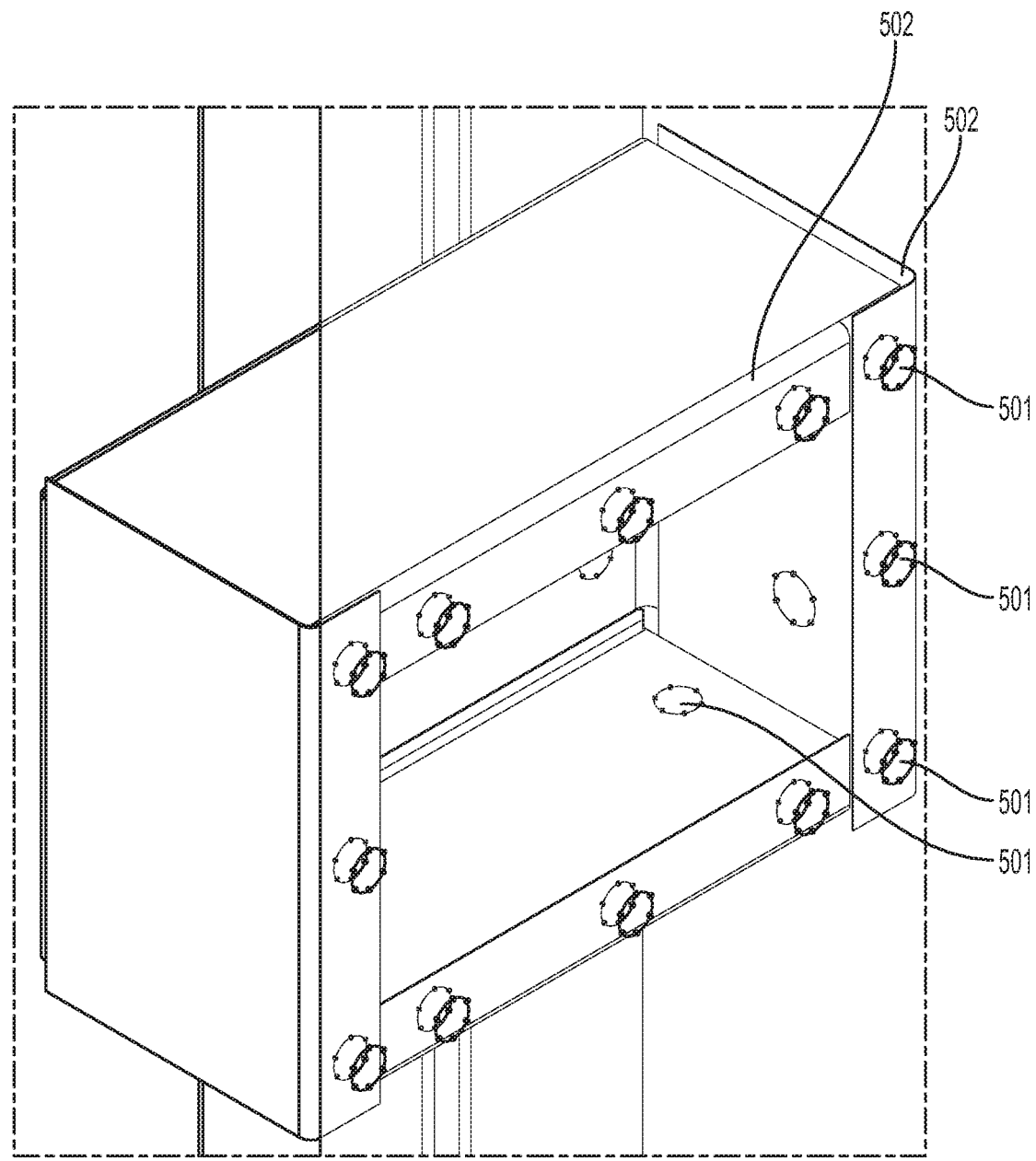
FIG. 5 is a perspective view of the portion of the rack of FIG. 4 with nodes of annular edges identified.

At this point, as illustrated in block 302 of FIG. 3 and with reference to FIG. 5, the processor 41 finds all of the annular (or circular or rounded) edges 501 in the rack design 401 and in the housing design 410 that meet with a predefined parameter. As noted above, this predefined parameter may be defined such that only the annular, circular or rounded edges have a diameter that is equal to or less than a predefined or known rivet joint diameter are found. Thus, while twenty-seven annular edges 501 are found in the housing design 410, in particular, the processor 41 ignores or discards the rounded corners 502, for example, since they are not completely annular or circular and thus do not have a diameter.

Figure 6:
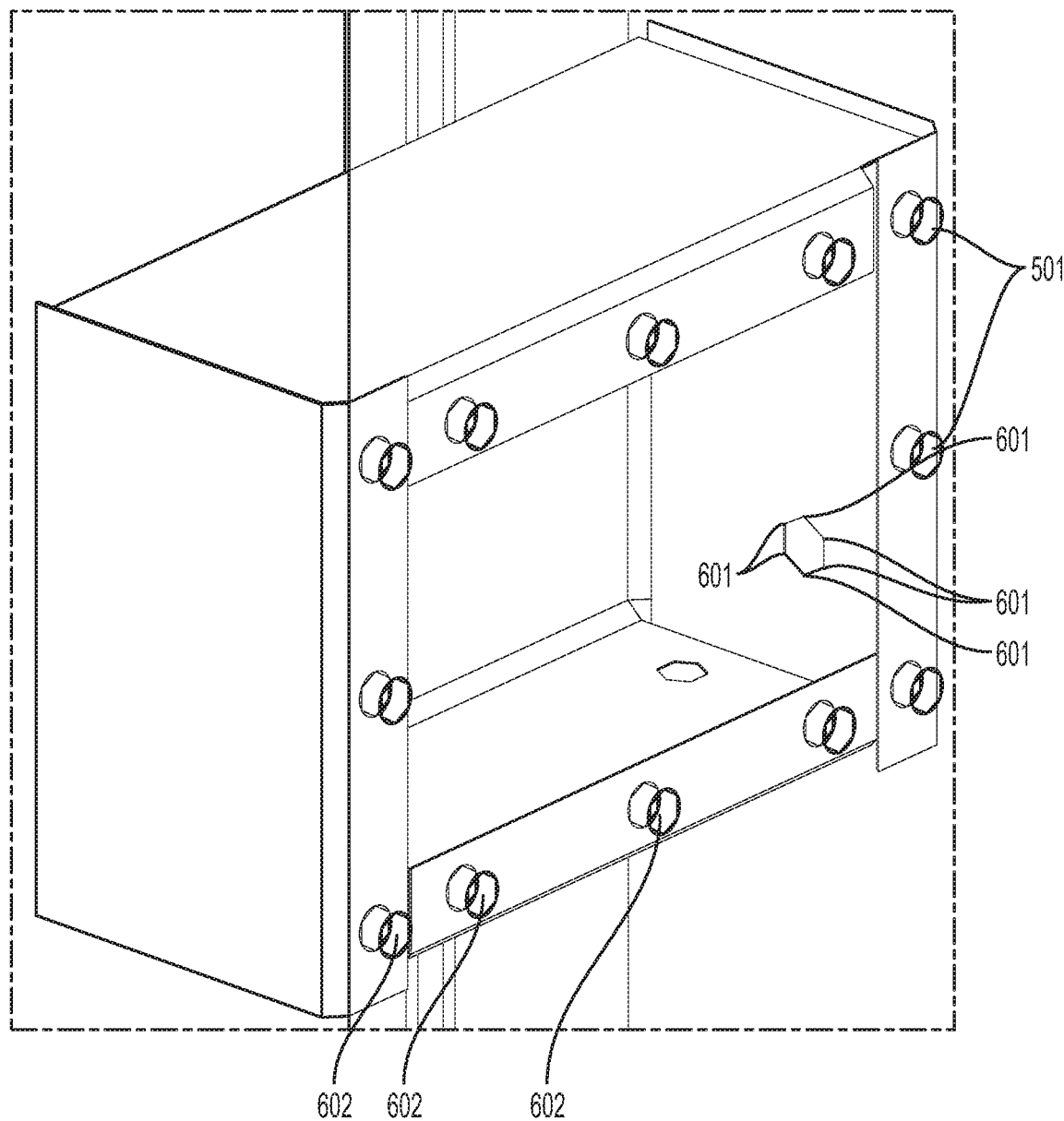
FIG. 6 is a perspective view of the portion of the rack of FIG. 4 with coordinates of the nodes averaged to identify centers of annular edges.

As illustrated in blocks 303, 304 and 305 and with reference to FIG. 6, each annular edge 501 may be redefined by the processor 41 as a collection of nodes 601 that are substantially evenly spaced about the annular edge 501. The number of nodes 601 for each annular edge 501 may vary based on available computing resources and a desired level of accuracy whereby a lower number of nodes 601 will ultimately require less computing resources and can be associated with a relatively fast computational period but might sacrifice some degree of accuracy and a higher number of nodes 601 will provide greater accuracy but will require increased computing resources and computational periods. Therefore, while embodiments in which six nodes 601 will be assumed for each annular edge 501, it is to be understood that greater or lesser numbers of nodes 601 can be used.

With the above in mind, once the annular edges 501 are found, the processor 41 gathers the coordinates of most or all of the nodes 601 (for purposes of clarity and brevity, the embodiments in which all the nodes are used will be described) on the found annular edges as illustrated in block 303 of FIG. 3, calculates average coordinates for the nodes 601 as illustrated in block 304 of FIG. 3 and identifies the average coordinates of all of the nodes 601 as a center point 602 for each found annular edge 501 as illustrated in block 305 of FIG. 3.

Figure 7:
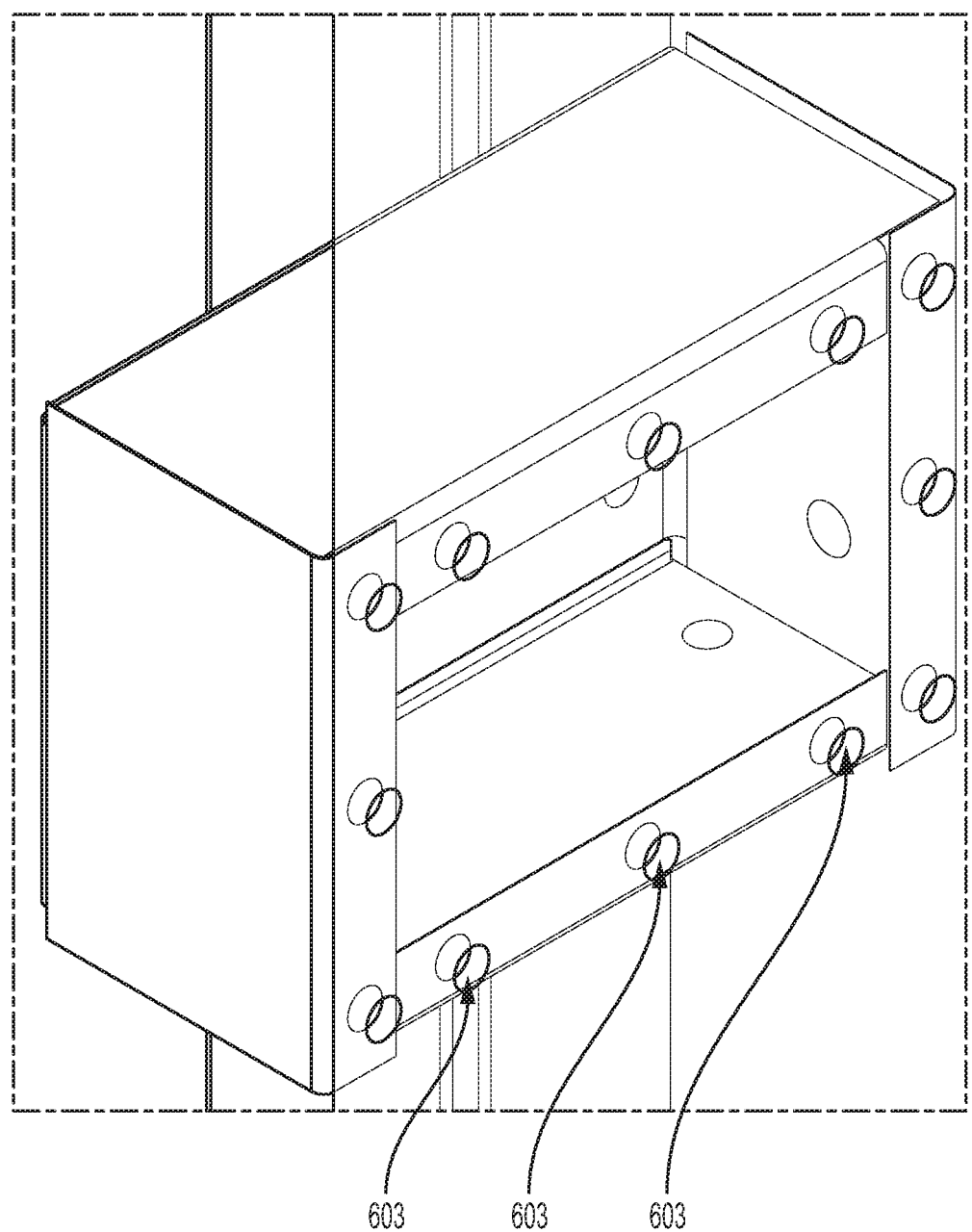
FIG. 7 is a perspective view of the portion of the rack of FIG. 4 with proximal centers identified.

At this point, as illustrated in block 306 of FIG. 3 and with reference to FIG. 7, the processor 41 identifies pairs of proximal center points 603 where a requirement for proximity is defined, for example, such that the processor 41 identifies only those pairs of center points 603 which are separated from one another by distances that are equal to or less than a predefined or known maximum sheet metal thickness. Thus, while twenty-seven annular edges 501 are found in the housing design 410, in particular, the processor 41 ignores or discards those annular edges 501 whose center points 602 are not paired with another proximal center point. That is the three unpaired annular edges in FIG. 7 are discarded for lack of a pair and twenty-four paired annular edges are identified.

Figure 8:
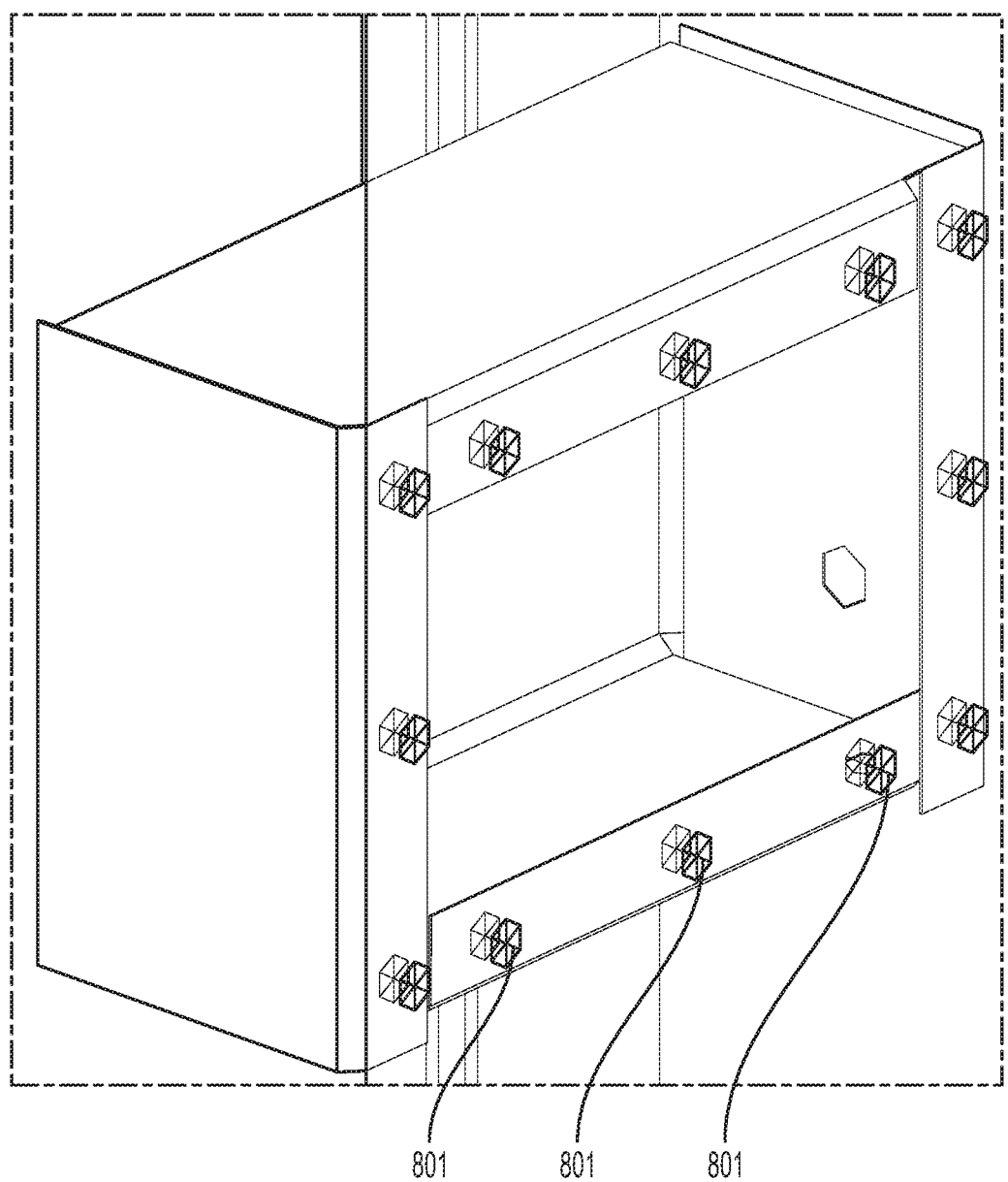
FIG. 8 is a perspective view of the portion of the rack of FIG. 4 with the nodes of annular edges connected with the corresponding centers.
Figure 9:
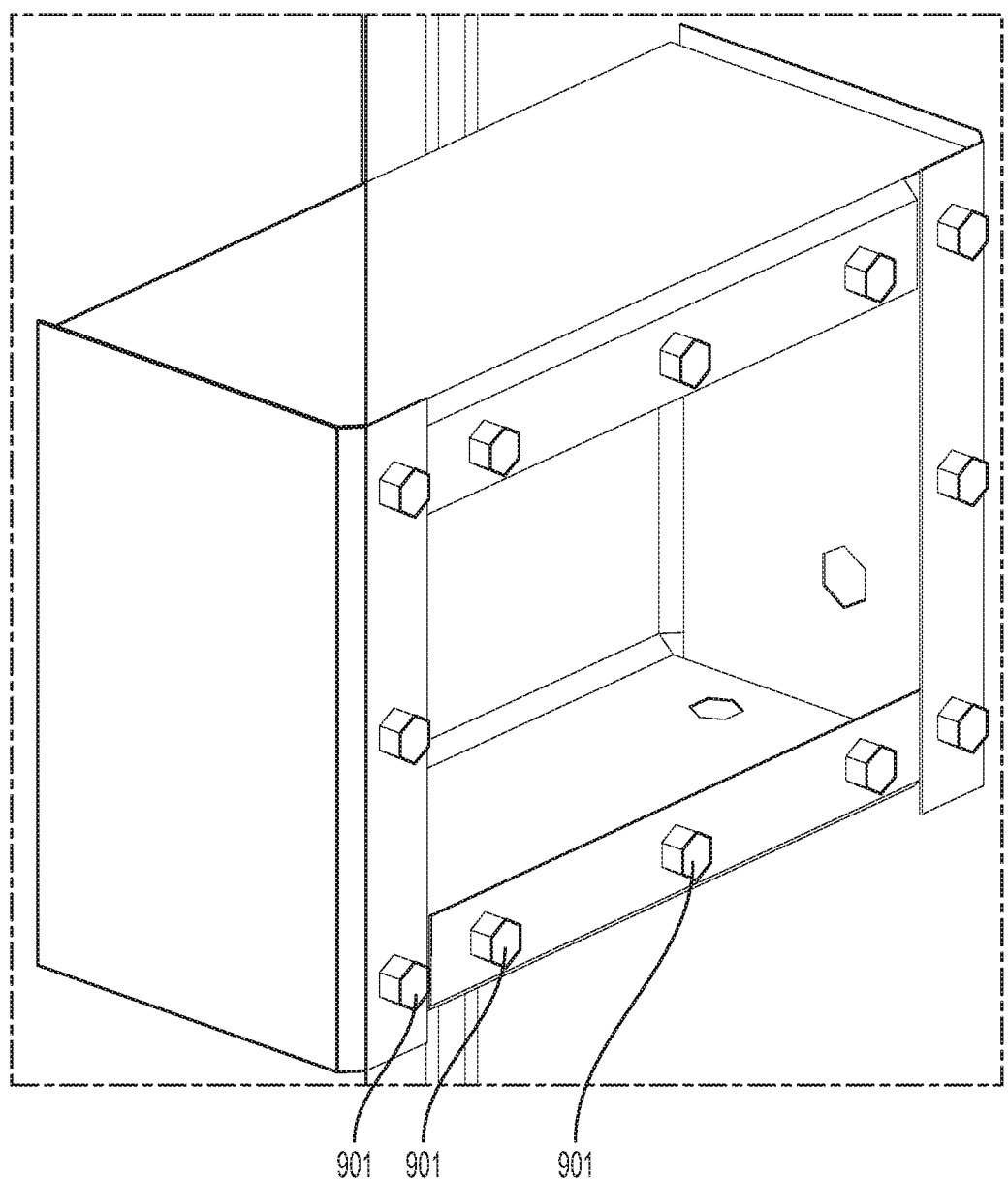
FIG. 9 is a perspective view of the portion of the rack of FIG. 4 with the corresponding centers connected by generated beams.

As illustrated in blocks 307 and 308 of FIG. 3 and with reference to FIGS. 8 and 9, for each pair of proximal center points 603, the processor 41 connects the nodes 601 with their corresponding center point 603 with certain predefined constraints 801 on rigidity or other physical characteristics and generates a virtualized beam element 901 in order to connect the proximal center points 603 in accordance with the certain predefined constraints and will thereafter be usable in further calculations relating to the overall structural rigidity and soundness of the rack design 401 and the housing design 410. As shown in FIG. 9, where six nodes 601 are used for each annular edge 501, the virtualized beam element 901 will be provided as a beam with a hexagonal cross-sectional area.

Figure 10:
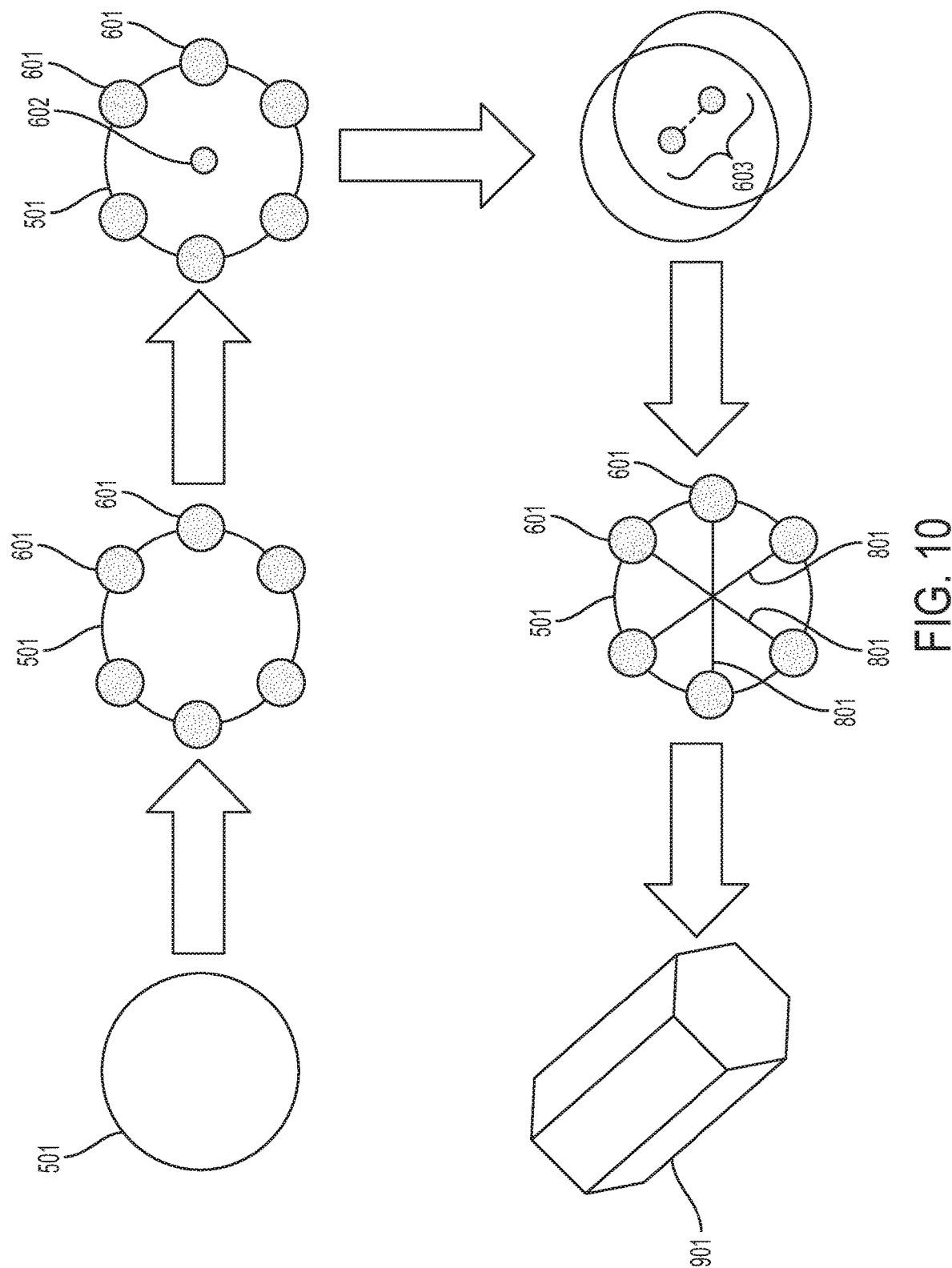
FIG. 10 is a schematic flow diagram illustrating a generation of a virtualized beam element in accordance with embodiments.

The generation of the virtualized beam element 901 from the annular edges 501 can be viewed clearly in FIG. 10.

Once the virtualized beam element 901 is generated, the processor 41 conducts a beam analysis of each of the generated virtualized beam elements 901 as illustrated in block 309 of FIG. 3, assesses an ability of the rack to satisfy predefined requirements based on or by using the results of the beam analysis as illustrated in block 310 of FIG. 3 and iteratively re-designs the rack in accordance with a determination that the rack is unable to satisfy the predefined requirements until the rack is determined to be able to satisfy the predefined requirements as illustrated in block 311 of FIG. 3.

Figure 11:
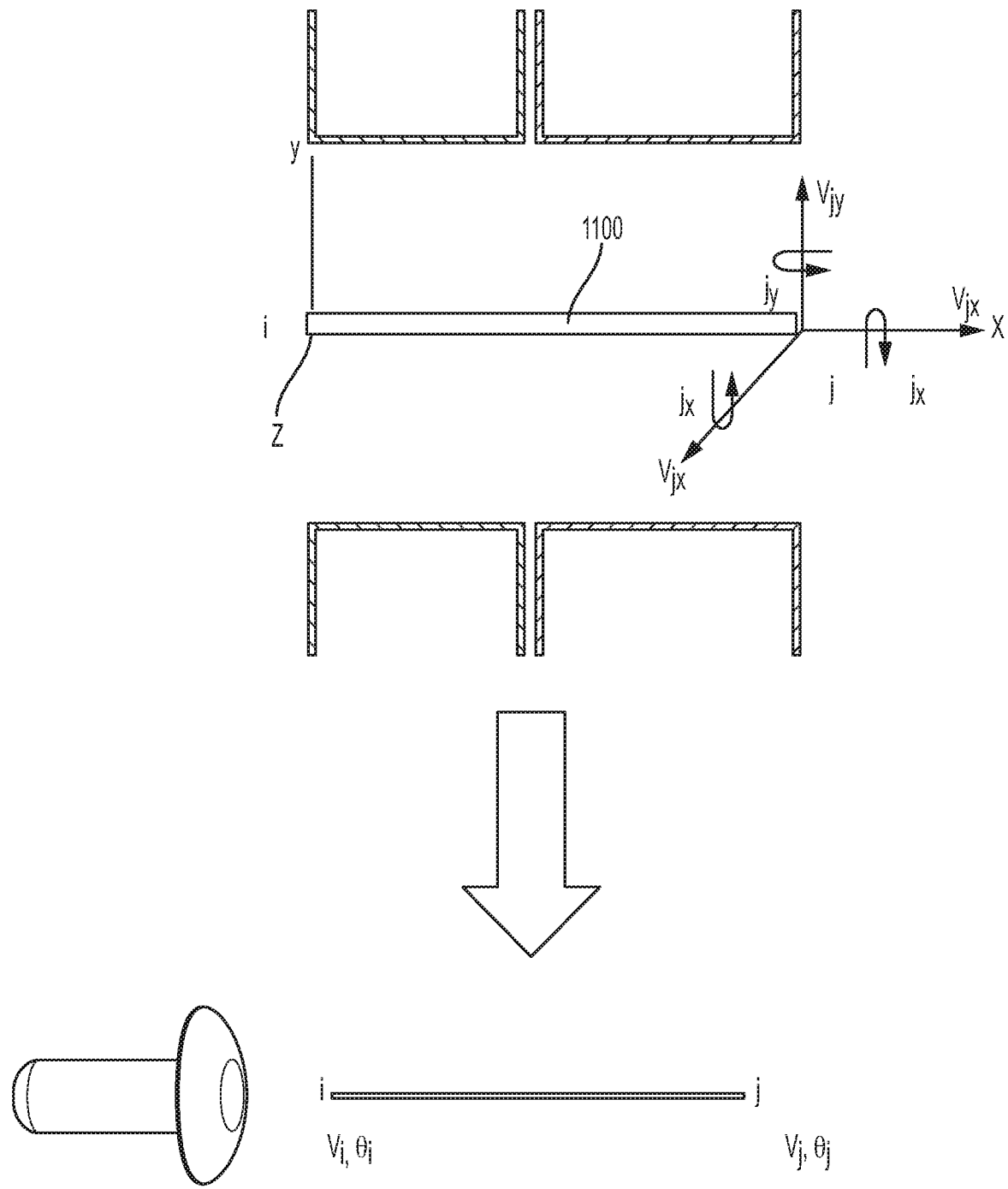
FIG. 11 is an illustrative explanation of a beam analysis in accordance with embodiments.

In accordance with embodiments and with reference to FIG. 11, the beam analysis may be conducted by the processor 41 as follows. As shown in FIG. 11, a beam element 1100 (such as the generated virtualized beam elements 901) is considered and loaded in such a way that it has deflection values: $v_i=1$, $\theta_i=0$, $v_j=0$ and $\theta_j=0$. A relationship, $F=K*X$ is then established in which F=load matrix, K=stiffness matrix, X=deflection and angle rotation matrix and m=a mass matrix. This leads to the formation of a matrix:

$$\begin{pmatrix} F_i \\ M_i \\ F_j \\ M_j \end{pmatrix} = \begin{pmatrix} (12EI)/L^3 & (6EI)/L^2 & -(12EI)/L^3 & (6EI)/L^2 \\ (6EI)/L2 & (4EI)/L & -(6EI)/L^2 & (2EI)/L \\ -(12EI)/L^3 & -(6EI)/L^2 & (12EI)/L^3 & -(6EI)/L^2 \\ (6EI)/L^2 & (2EI)/L & -(6EI)/L^2 & (4EI)/L \end{pmatrix} \begin{pmatrix} v_i \\ \theta_i \\ v_j \\ \theta_j \end{pmatrix}$$

Where $F_i$, $M_i$, $F_j$, $M_j$ are the loads corresponding to the deflections $v_i$, $\theta_i$, $v_j$, $\theta_j$.

By applying Newton's second law of motion, f=ma, to the mass, the equation of motion in the x direction can be obtained: $F(t)-kx=m*\partial^2(x)$.

Figure 12:
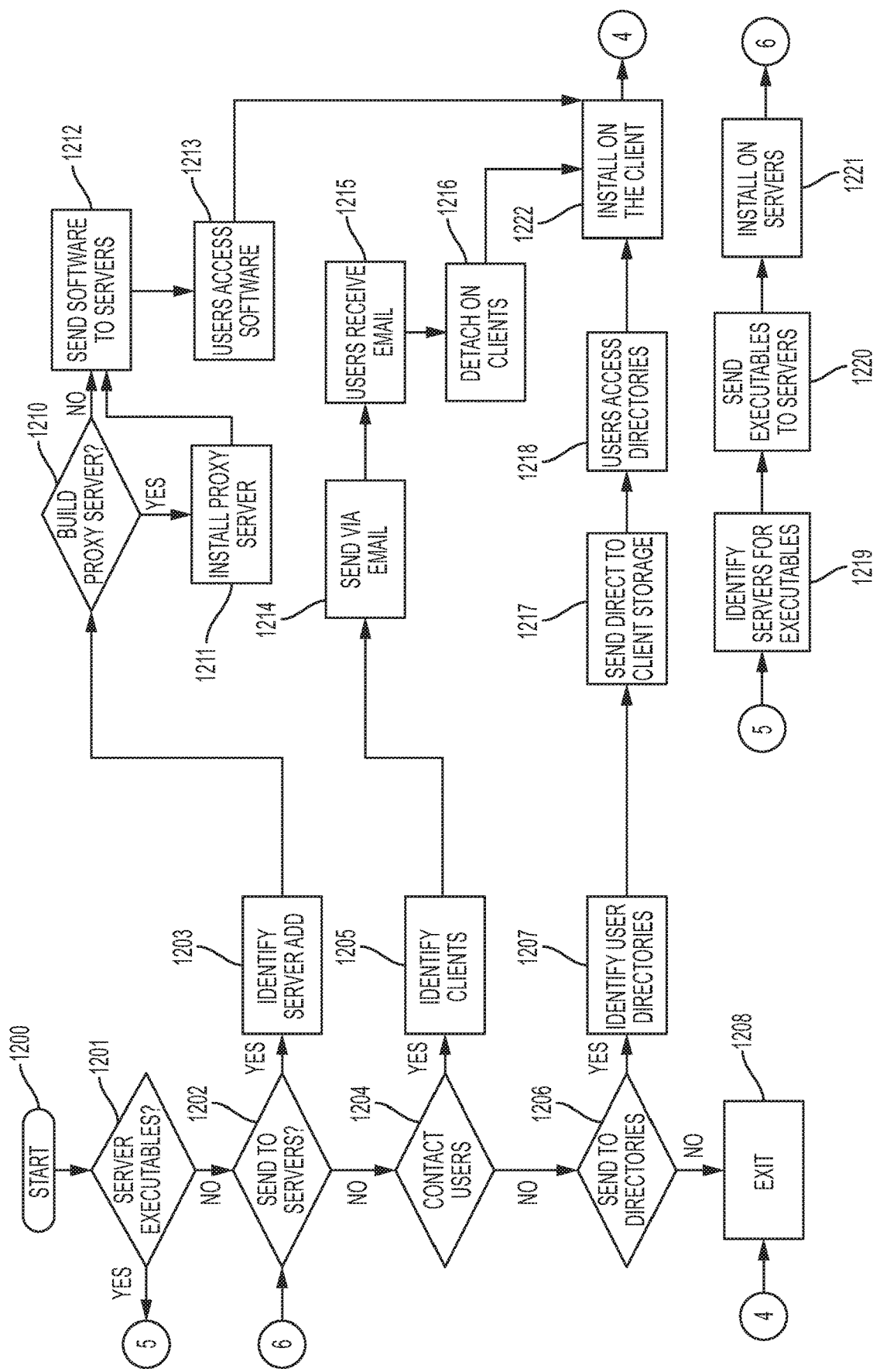
FIG. 12 is a flow diagram illustrating a deployment method for a computer program product for analyzing a rack with riveted joints in accordance with embodiments.

With reference to FIG. 12, the deployment of process software including the executable instructions 420 will now be described at begins with block 1200. An initial operation is to determine if there are any programs that will reside on a server or servers when the process software is executed (block 1201). If this is the case, then the servers that will contain the executables are identified (block 1219). The process software for the server or servers is transferred directly to the servers' storage via FTP or some other protocol or by copying though the use of a shared file system (block 1220) and is then installed on the servers (block 1221).

Next, a determination is made on whether the process software is to be deployed by having users access the process software on a server or servers (block 1202). If the users are to access the process software on servers, then the server addresses that will store the process software are identified (block 1203).

A determination is made if a proxy server is to be built (block 1210) to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed (block 1211). The process software is sent to the (one or more) servers either via a protocol such as FTP, or it is copied directly from the source files to the server files via file sharing (block 1212). Another embodiment involves sending a transaction to the (one or more) servers that contained the process software, and have the server process the transaction and then receive and copy the process software to the server's file system. Once the process software is stored at the servers, the users via their client computers then access the process software on the servers and copy to their client computers file systems (block 1213). Another embodiment is to have the servers automatically copy the process software to each client and then run the installation program for the process software at each client computer. The user executes the program that installs the process software on his client computer (block 1222) and then exits the process (block 1208).

In block 1204, a determination is made whether the process software is to be deployed by sending the process software to users via e-mail. The set of users where the process software will be deployed is identified together with the addresses of the user client computers (block 1205). The process software is sent via e-mail to each of the users' client computers (block 1214), the users receive the e-mail (block 1215) and detach the process software from the e-mail to a directory on their client computers (block 1216). The user executes the program that installs the process software on his client computer (block 1222) and then exits the process (block 1208).

Lastly, a determination is made on whether the process software will be sent directly to user directories on their client computers (block 1206). If so, the user directories are identified (block 1207). The process software is transferred directly to the user's client computer directory (block 1217). This can be done in several ways such as, but not limited to, sharing the file system directories and then copying from the sender's file system to the recipient user's file system or, alternatively, using a transfer protocol such as File Transfer Protocol (FTP). The users access the directories on their client file systems in preparation for installing the process software (block 1218), execute the program that installs the process software on client computers (block 1222) and then exits the process (block 1208).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method to analyze a rack with riveted joints, the method comprising:
   importing a computer aided design (CAD) model of the rack;
   finding all annular edges in the CAD model that satisfy a predefined parameter, wherein the predefined parameter comprises a diameter equal to or less than a rivet joint diameter;
   gathering coordinates of nodes on the found annular edges, calculating average coordinates for the nodes of each found annular edge, and identifying the average coordinates as a center point for each found annular edge;
   identifying pairs of proximal center points separated by a distance equal to or less than a maximum sheet metal thickness of the rack;
   discarding one or more annular edges comprising an unpaired center point;
   for each pair of proximal center points:
      connecting the nodes on each of the found annular edges with the corresponding center point with rigid constraints to generate a first connected center point and a second connected center point; and
      generating a beam element connecting the proximal center points in accordance with the rigid constraints;
   for each generated beam element, conducting a beam analysis to form a matrix by loading the generated beam element with a first deflection value set to 1, a second deflection value set to 0, a third deflection value set to 0, and a fourth deflection value set to 0, wherein each of the deflection values are associated with a deflection load and an angle of rotation along an axis of the generated beam element, and wherein the formed matrix is defined by a relationship $F=K*X$, where F comprises a load matrix, K comprises a stiffness matrix, and X comprises a deflection and angle rotation matrix; and
   solving the formed matrix with a mass to obtain results of the beam analysis comprising a representation of motion in a direction along the axis of the beam element.

2. The method according to claim 1, wherein the method further comprises:
   assessing an ability of the rack to satisfy predefined requirements based on results of the beam analysis; and
   re-designing the rack in accordance with a determination that the rack is unable to satisfy the predefined requirements.

3. The method according to claim 1, wherein the annular edges comprise circular edges.

4. The method according to claim 1, wherein the nodes comprise at least six or more evenly distributed nodes.

5. A computer program product for analyzing a rack or other mechanical assembly with riveted joints, the computer program product comprising:
   a processor; and
   a memory unit having executable instructions stored thereon, which, when executed, cause the processor to execute a method comprising:
   importing a computer aided design (CAD) model of the rack;
   finding all annular edges in the CAD model that satisfy a predefined parameter, wherein the predefined parameter comprises a diameter equal to or less than a rivet joint diameter;
   gathering coordinates of nodes on the found annular edges, calculating average coordinates for the nodes of each found annular edge, and identifying the average coordinates as a center point for each found annular edge;
   identifying pairs of proximal center points separated by a distance equal to or less than a maximum sheet metal thickness of the rack;
   discarding one or more annular edges comprising an unpaired center point;
   for each pair of proximal center points:
      connecting the nodes on each of the found annular edges with the corresponding center point with rigid constraints to generate a first connected center point and a second connected center point; and
      generating a beam element connecting the proximal center points in accordance with the rigid constraints;
   for each generated beam element, conducting a beam analysis to form a matrix by loading the beam element with a first deflection value set to 1, a second deflection value set to 0, a third deflection value set to 0, and a fourth deflection value set to 0, wherein each of the deflection values are associated with a deflection load and an angle of rotation along an axis of the generated beam element, and wherein the formed matrix is defined by a relationship $F=K*X$, where F comprises a load matrix, K comprises a stiffness matrix, and X comprises a deflection and angle rotation matrix; and
   solving the formed matrix with a mass to obtain results of the beam analysis comprising a representation of motion in a direction along the axis of the beam element.

6. The computer program product according to claim 5, wherein the method further comprises:

assessing an ability of the rack to satisfy predefined requirements based on results of the beam analysis; and re-designing the rack in accordance with a determination that the rack is unable to satisfy the predefined requirements.

7. The computer program product according to claim 5, wherein the annular edges comprise circular edges.

8. The computer program product according to claim 5, wherein the nodes comprise at least six or more evenly distributed nodes.

9. A system for analyzing a rack with riveted joints, the system comprising:

a processor; and a memory unit having executable instructions stored thereon, which, when executed, cause the processor to:

import a computer aided design (CAD) model of the rack;

find all annular edges in the CAD model that satisfy a predefined parameter, wherein the predefined parameter comprises a diameter equal to or less than a rivet joint diameter;

gather coordinates of nodes on the found annular edges, calculate average coordinates for the nodes of each found annular edge, and identify the average coordinates as a center point for each found annular edge;

identify pairs of proximal center points separated by a distance equal to or less than a maximum sheet metal thickness of the rack;

discarding one or more annular edges comprising an unpaired center point;

for each pair of proximal center points:

connect the nodes on each of the found annular edges with the corresponding center point with rigid constraints to generate a first connected center point and a second connected center point; and generate a beam element connecting the proximal center points in accordance with the rigid constraints;

for each generated beam element, conducting a beam analysis to form a matrix by loading the beam element with a first deflection value set to 1, a second deflection value set to 0, a third deflection value set to 0, and a fourth deflection value set to 0, wherein each of the deflection values are associated with a deflection load and an angle of rotation along an axis of the generated beam element, and wherein the formed matrix is defined by a relationship $F=K*X$, where F comprises a load matrix, K comprises a stiffness matrix, and X comprises a deflection and angle rotation matrix; and solving the formed matrix with a mass to obtain results of the beam analysis comprising a representation of motion in a direction along the axis of the beam element.

10. The system according to claim 9, wherein the executable instructions, when executed, further cause the processor to:

assess an ability of the rack to satisfy predefined requirements based on results of the beam analysis; and re-design the rack in accordance with a determination that the rack is unable to satisfy the predefined requirements.

11. The system according to claim 9, wherein the annular edges comprise circular edges.

12. The system according to claim 9, wherein the nodes comprise at least six or more evenly distributed nodes.

* * * * *